US009204565B1

(12) United States Patent
Lee et al.

(10) Patent No.: US 9,204,565 B1
(45) Date of Patent: Dec. 1, 2015

(54) FOLDABLE DISPLAY APPARATUS

(71) Applicant: LG Display Co., Ltd., Seoul (KR)

(72) Inventors: Dal Jae Lee, Seoul (KR); Su Chan Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/710,477

(22) Filed: May 12, 2015

(30) Foreign Application Priority Data

Dec. 30, 2014 (KR) ........................ 10-2014-0194092

(51) Int. Cl.
*G06F 1/16* (2006.01)
*H05K 5/02* (2006.01)
*H05K 5/00* (2006.01)
*E05D 7/00* (2006.01)

(52) U.S. Cl.
CPC ................ *H05K 5/0226* (2013.01); *E05D 7/00* (2013.01); *H05K 5/0017* (2013.01)

(58) Field of Classification Search
CPC combination set(s) only.
See application file for complete search history.

(56) References Cited

U.S. PATENT DOCUMENTS 6,377,324 B1 * 4/2002 Katsura ........................... 349/58
6,577,496 B1 * 6/2003 Gioscia et al. ............. 361/679.3
6,996,424 B2 * 2/2006 Ijas et al. ................... 455/575.1
8,248,764 B2 * 8/2012 Hassemer et al. ....... 361/679.01
8,804,349 B2 * 8/2014 Lee et al. ....................... 361/749
8,971,032 B2 * 3/2015 Griffin et al. ............ 361/679.27
9,013,864 B2 * 4/2015 Griffin et al. ............ 361/679.21
2003/0026068 A1 * 2/2003 Tsai et al. ...................... 361/683
2010/0182738 A1 * 7/2010 Visser et al. ............. 361/679.01
2010/0201604 A1 * 8/2010 Kee et al. ........................ 345/1.3
2011/0063783 A1 * 3/2011 Shim et al. ............... 361/679.01
2011/0128216 A1 * 6/2011 Renwick ........................ 345/156
2012/0002360 A1 * 1/2012 Seo et al. ................. 361/679.01
2012/0044620 A1 * 2/2012 Song et al. ............... 361/679.01
2012/0120618 A1 * 5/2012 Bohn ............................. 361/749
2012/0200991 A1 * 8/2012 Ryu ........................... 361/679.01
2012/0236476 A1 * 9/2012 Wu et al. .................. 361/679.01
2012/0236484 A1 * 9/2012 Miyake .................... 361/679.01
2012/0314399 A1 * 12/2012 Bohn et al. ................... 362/97.1
2012/0314400 A1 * 12/2012 Bohn et al. ................... 362/97.1
2013/0010405 A1 * 1/2013 Rothkopf et al. ........ 361/679.01
2013/0148278 A1 * 6/2013 Honda ..................... 361/679.01
2013/0314611 A1 * 11/2013 Okutsu et al. ................. 348/739
2014/0022714 A1 * 1/2014 Huang ..................... 361/679.01
2014/0029171 A1 * 1/2014 Lee ........................... 361/679.01
2014/0104765 A1 * 4/2014 Hoshino .................. 361/679.01
2014/0126121 A1 * 5/2014 Griffin et al. ............ 361/679.01
2015/0085433 A1 * 3/2015 Kim .......................... 361/679.01

* cited by examiner

*Primary Examiner* — Lisa Lea Edmonds
(74) *Attorney, Agent, or Firm* — Fenwick & West LLP

(57) ABSTRACT

Embodiments relate to a hinge assembly in a foldable display device that provides support for a bending portion of a flexible display panel when the foldable display device in an unfolded state. The hinge assembly includes a bending portion support assembly and a sliding member that is slidable relative to the bending portion support assembly as the foldable display device is folded or unfolded. The hinge assembly also includes a surface that abuts the bending portion of the flexible display panel that defines the curvature of the flexible display panel when the foldable display device is rotated from the unfolded state.

18 Claims, 9 Drawing Sheets

FOLDABLE DISPLAY APPARATUS

CROSS-REFERENCE TO RELATED APPLICATION

This application claims the benefit of the Korean Patent Application No. 10-2014-0194092 filed on Dec. 30, 2014, which is hereby incorporated by reference as if fully set forth herein.

BACKGROUND

1. Field of the Invention

The present invention relates to a foldable display apparatus, and more particularly, to a foldable display apparatus which is bent at a certain curvature or is unfolded into a flat state.

2. Discussion of the Related Art

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

Recently, even in portable electronic devices, the demand for a large screen is increasing, and thus, an apparatus including a display unit displaying a large screen is being developed and commercialized by connecting a flat display panel. In particular, foldable display apparatuses using the merits of a flexible display panel which is bendable or foldable are convenience due to portability and include a display unit which displays a large screen, and thus are attracting much attention as next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, tablet PCs.

The foldable display apparatuses may include, for example, a flexible display apparatus disclosed in U.S. Patent Publication No. 2013/0010405. This U.S. patent publication discloses a flexible display apparatus that unfolds a flexible display with respect to a hinge having a link structure, thereby providing a large screen. However, the flexible display apparatus disclosed in this U.S. patent publication cannot maintain a bending area of an unfolded flexible display in a flat state due to an empty space between housings connected by hinges and their link structure.

SUMMARY

Embodiments relate to a hinge assembly in a foldable display device including a bending portion support assembly and a sliding member. The bending portion support assembly couples to a first frame in a rotatable manner and provides support for a bending portion of a flexible display panel in an unfolded state of the foldable display device. The first frame is secured to a first area of the flexible display panel adjacent to a first side of the bending portion in the unfolded state to provide support for the first area of the flexible display. The sliding member couples to a second frame and slide relative to the first assembly with rotation of the first frame relative to the second frame. The second frame is secured to a second area of the flexible display panel adjacent to a second side of the bending portion in the unfolded state to provide support for the second area of the flexible display.

In one embodiment, the bending portion support assembly includes a first hinge part and a second hinge part. The first hinge part secures to the first frame. The second hinge part engages with the first hinge part and is coupled to a panel support member that provides a surface for supporting the bending portion in the unfolded state. The second hinge part rotates about the first hinge part between the unfolded state and a folded state of the foldable display device.

In one embodiment, at least one of the first hinge part or the second hinge part includes a curved surface with a predetermined curvature. The curved surface defines the curvature of the bending portion in a folding state, an unfolding state or a folded state of the foldable display device.

In one embodiment, the hinge assembly includes sliding guiding members between the bending portion support assembly and the sliding member to control a sliding trajectory of the bending portion support assembly relative to the sliding member.

In one embodiment, each of the sliding guiding members is formed with a guide slot to receive a sliding skirt of the bending support assembly. The guide slot has at least one curved surface having a radius of curvature across a plane perpendicular to a sliding direction of the bending support assembly to cause the bending support assembly to slide over or under a panel supporting member secured to the second frame in a folding or unfolding state of the foldable display device.

In one embodiment, the hinge assembly further includes a spring having a first end attached to the bending support assembly and a second end attached to the sliding member to apply resilient force to the sliding member in an unfolding state or folding state.

In one embodiment, the spring applies the resilient force to place the foldable display device in the unfolded state responsive to a sliding distance of the sliding member relative the bending support assembly being smaller than a threshold distance. The spring applies the resilience force to place the foldable display device in a folded state responsive to the sliding distance of the sliding member being larger than the threshold distance.

In one embodiment, the hinge assembly further includes a rotation axis member inserted into the sliding member and the second frame to couple the sliding member to the second frame in a rotatable manner.

In one embodiment, the bending portion support assembly includes a bending portion support member, a sliding bridge, a set of hinge parts, and a slider. The bending portion support member provides a supporting surface to the bending portion of the flexible display panel. The sliding bridge is secured to the bending portion support member. Each of the hinge parts is secured to a side portion of the sliding bridge. A slider is secured to the sliding bridge and is formed with sliding slots to receive ends of the sliding member in a slidable manner.

In one embodiment, sliding guide members coming into touch with the sliding member are secured into the sliding slots. The sliding guide members are formed with protrusions or holes for securing the sliding guide members.

Embodiments also related to a foldable display device including a flexible display panel, a first frame, a second frame and a hinge assembly. The first frame secures a first area of the flexible display panel. The second frame secures a second area of the flexible display panel. The hinge assembly is placed between the first frame and the second frame. The hinge assembly includes a bending portion support assembly and a sliding member. The bending portion support assembly is coupled to the first frame in a rotatable manner and provides support for a bending portion of the flexible display panel between the first area and the second area in an unfolded state of the foldable display device. The sliding member is coupled to a second frame and slidable relative to the first assembly with rotation of the first frame relative to the second frame.

In one embodiment, the foldable display device further includes a first supporting member and a second supporting member. The first supporting member is placed between the first frame and the first area. The first supporting member has a flat surface onto which the first area is secured. The second supporting member is placed between the second frame and the second area. The second supporting member has a flat surface onto which the second area is secured.

Embodiments are also related to folding or unfolding a foldable display device. In an unfolded state of the foldable display device, a first area of a flexible display panel is supported by a first frame, a second area of the flexible display panel is supported by a second frame and a bending portion of the foldable display panel is supported by a hinge assembly between the first frame and the second frame. Responsive to rotating the first frame relative to the second frame from the unfolded state, a sliding member of the hinge assembly coupled to a second frame is slided relative to a bending portion support assembly coupled to the first frame.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
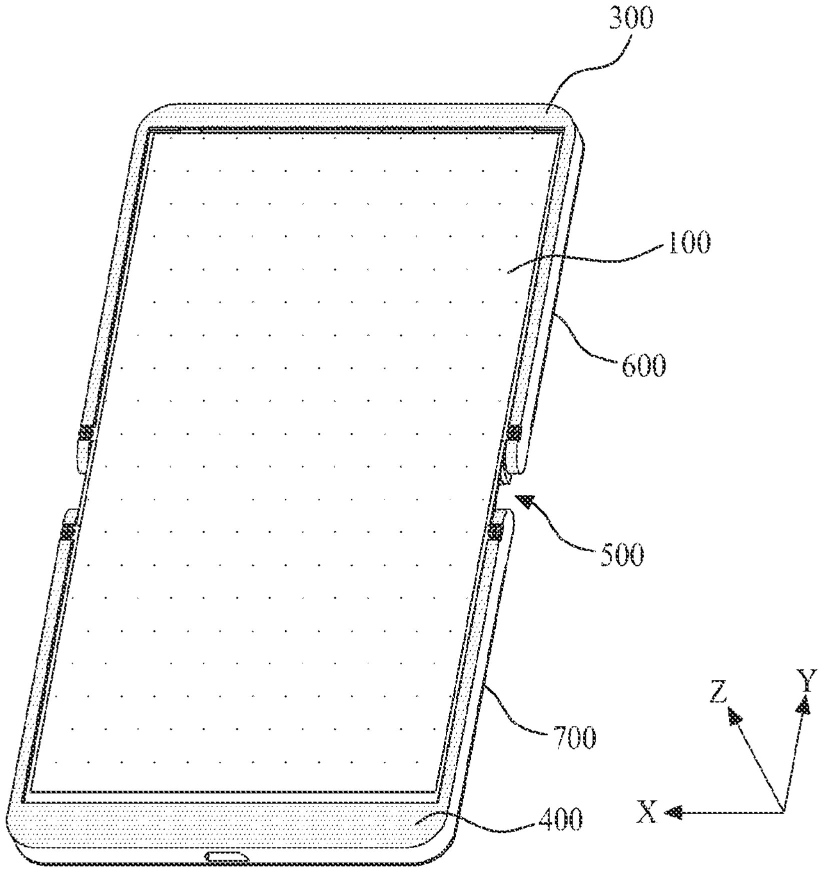
FIG. 1 is a perspective view illustrating a foldable display apparatus according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "on" should be construed as including a case where one element is formed at a top of another element and moreover a case where a third element is disposed therebetween.

Hereinafter, exemplary embodiments of a foldable display apparatus according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
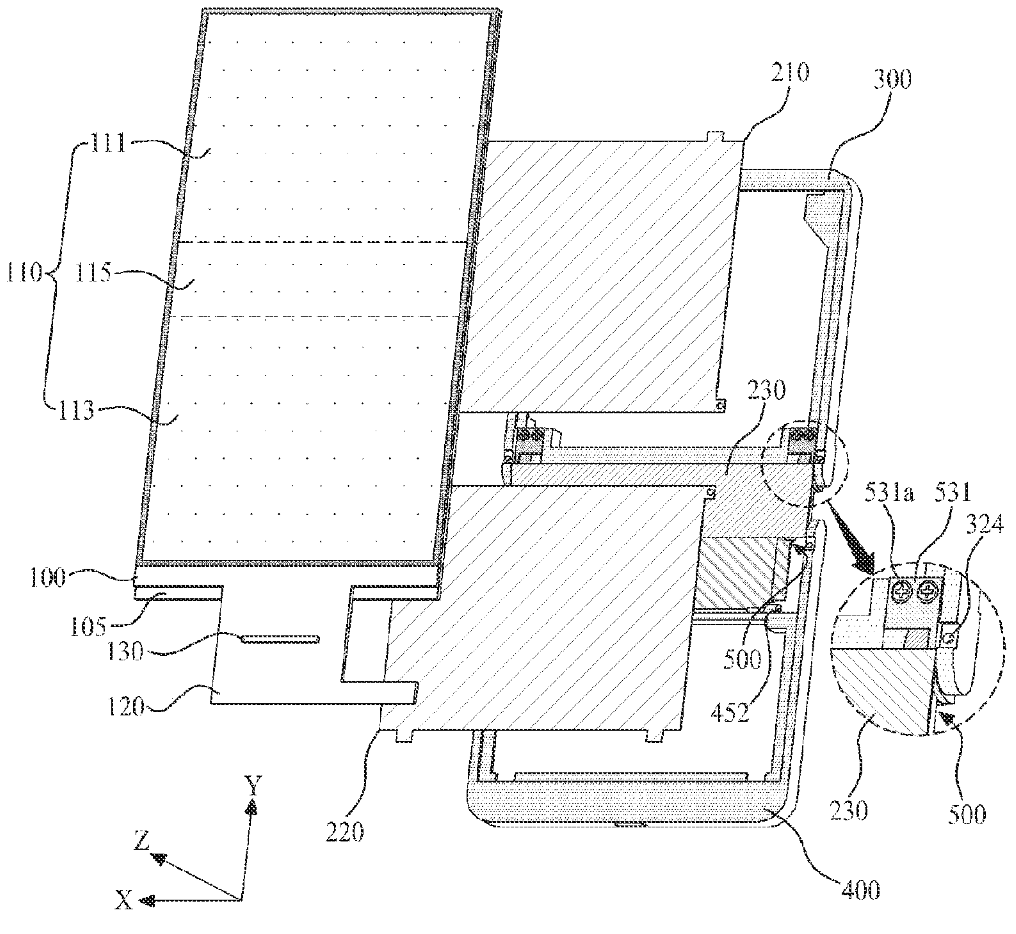
FIG. 2 is an exploded perspective view illustrating a foldable display apparatus according to an embodiment of the present invention.
Figure 3:
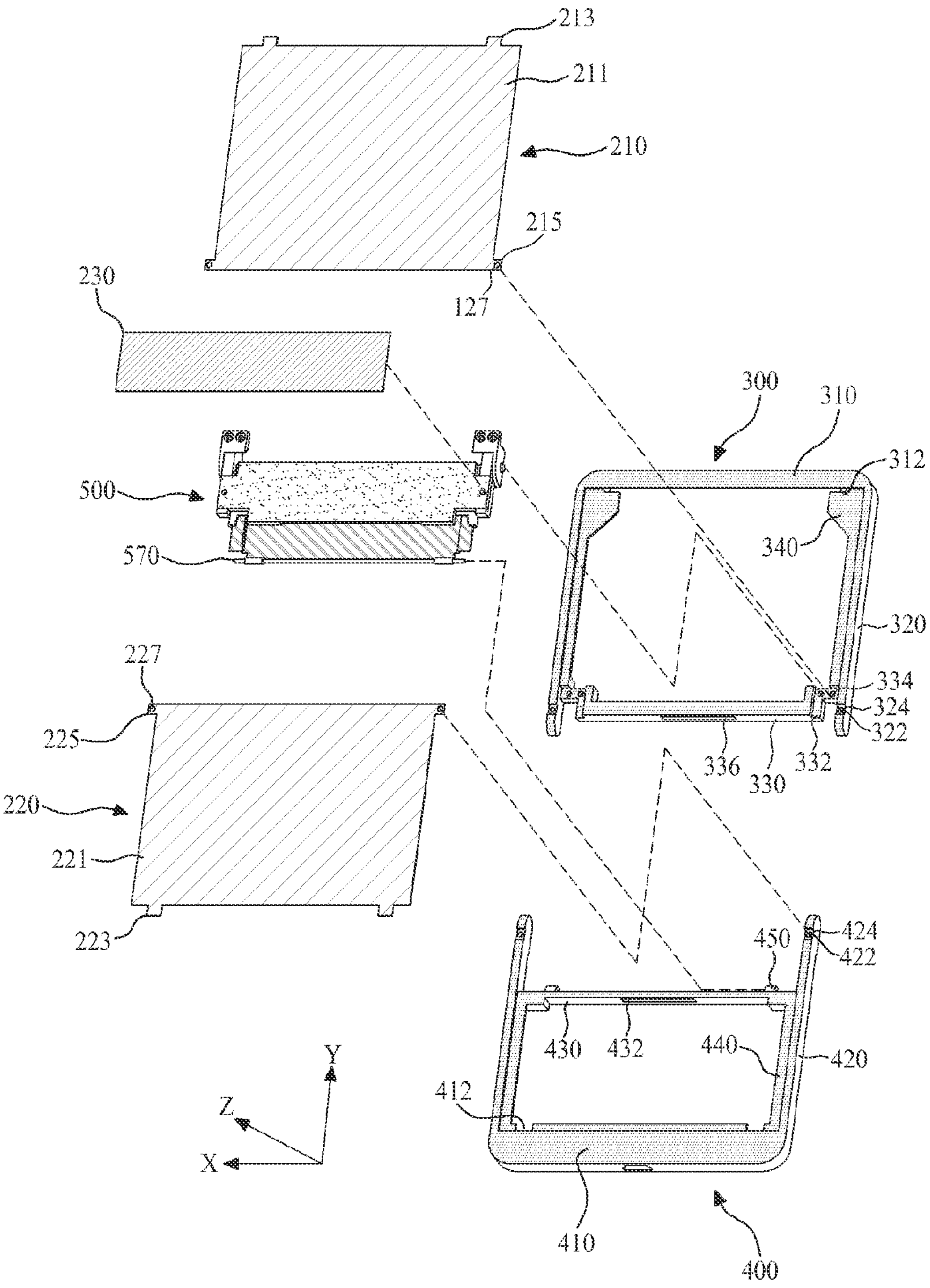
FIG. 3 is a detailed exploded perspective view for describing first to third panel supporting members, first and second frames, and a hinge assembly illustrated in FIG. 2.

FIG. 1 is a perspective view illustrating a foldable display apparatus according to an embodiment of the present invention. FIG. 2 is an exploded perspective view illustrating the foldable display apparatus according to an embodiment of the present invention. FIG. 3 is a detailed exploded perspective view for describing first to third panel supporting members, first and second frames, and a hinge assembly illustrated in FIG. 2.

Referring to FIGS. 1 to 3, the foldable display apparatus according to an embodiment of the present invention includes a display panel 100, first to third panel supporting members 210, 220 and 230, a first frame 300, a second frame 400, and a hinge assembly 500.

The display panel 100 may be a flexible display panel using a flexible substrate. For example, the display panel 100 may be a flexible organic light emitting display panel, a flexible electrophoretic display panel, a flexible liquid crystal display panel, or a flexible electro-wetting display panel.

The display panel 100 may include a flexible pixel array substrate, which includes an active matrix type pixel array, and an encapsulation member for protecting the pixel array.

The flexible pixel array substrate may be formed of a plastic material or a metal foil. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

The pixel array includes a plurality of pixels. Each of the pixels is provided in a plurality of pixel areas defined adjacent to intersection areas of a plurality of gate lines and a plurality of data lines. Each of the plurality of pixels includes a display device that displays an image corresponding to an image signal. The display device may be an organic light emitting device, a liquid crystal display device, an electrophoretic device, or an electro-wetting display device.

When the display device is the organic light emitting device or the electrophoretic device, the encapsulation member according to an embodiment is formed on a flexible substrate to cover a pixel array, and may be a flexible encapsulation substrate or an encapsulation layer. When the display device is the liquid crystal display device, the electro-wetting display device, or the electrophoretic device, an encapsulation member according to another embodiment may be a flexible color filter substrate that includes a color filter corresponding to a pixel.

In addition, the display panel 100 may further include a polarizing film attached to the encapsulation member, but the polarizing film may be omitted depending on an image realization method of the display panel 100.

The foldable display apparatus according to an embodiment of the present invention may further include a touch screen (not shown) for a user interface using a user's touch. The touch screen may be attached onto the display panel 100, or may be built into the display panel 100 in a process of forming the pixel array.

Referring to FIG. 2, the display panel 100 includes a display area 110 displaying an image by the pixel array having the plurality of pixels. The display area 110 may be divided into (i) a first area 111, (ii) a second area 113, and (iii) a bending area 115 between the first area 111 and the second area 113.

The first area 111 (for example, an upper area) may be defined as an area of the display panel 100 which is disposed at one side of the bending area 115 in the display area 110, and the second area 113 (for example, a lower area) may be defined as another area of the display panel 100 which is disposed at the other side of the bending area 115 in the display area 110.

When the display panel 100 is unfolded to a flat state, the first and second areas 111 and 113 and the bending area 115 may form a relatively broad continuous display area 110. The display panel 100 may include a signal applying unit 120 that extends from an edge of the first area 111 or the second area 113 to have a certain width and a certain length.

A plurality of link lines, which are connected to a signal line formed in the pixel array, may be formed in the signal applying unit 120. The signal applying unit 120 may pass through the second frame 400 and may be bent toward a rear surface of the second frame 400, for connecting to a system driver 10 (see FIG. 8A) on the rear surface of the second frame 400. A driving integrated circuit (IC) 130, which drives the pixels provided in the display area 110 according to a pixel driving signal and data signals supplied from the system driver 10, may be mounted on the signal applying unit 120.

The display panel 100 may be supported by a flexible supporting plate 105. The flexible supporting plate 105 may be attached to an entire rear surface of the display panel 100 and may maintain the flexible display panel 100 in a flat state. The flexible supporting plate 105 may be omitted depending on a flexible characteristic of the flexible pixel array substrate.

The first panel supporting member 210 supports the first area 111 of the display panel 100 and may be physically coupled to a rear surface of the first area 111 of the display panel 100 by an adhesive member (not shown). Referring to FIG. 3, the first panel supporting member 210 according to an embodiment may include a first base plate 211, a pair of upper ear parts 213, a pair of first side ear parts 215, and a pair of first screw through holes 127.

The first base plate 211 may be physically coupled to the rear surface of the first area 111 of the display panel 100 by the adhesive member. The first base plate 211 may be formed of a plastic material or a metal material, for maintaining the first area 111 of the flexible display panel 100 in a flat state. When the first base plate 211 is formed of a metal material, the first base plate 211 may also perform the function of dissipating heat generated in the display panel 100.

Each of the pair of upper ear parts 213 may protrude in a polygonal shape to have a certain length from an upper surface of the first base plate 211. The pair of upper ear parts 213 may be connected to an upper side of the first frame 300.

Each of the pair of first side ear parts 215 may protrude in a polygonal shape to have a certain length from both sides of a lower end of the first base plate 211. The pair of first side ear parts 215 may be connected to a lower end of the first frame 300.

The pair of first screw through holes 127 may be provided to respectively pass through the pair of first side ear parts 215 in direction Z. A pair of first screws (not shown) may be respectively inserted into the pair of first screw through holes 127. The pair of first screws may be coupled to the first frame 300 through the first screw through holes 127 and may detachably fix the first base plate 211 to the first frame 300.

The second panel supporting member 220 may support the second area 113 of the display panel 100 and may be physically coupled to a rear surface of the second area 113 of the display panel 100 by an adhesive member (not shown). In one embodiment, the second panel supporting member 220 has the same shape as the first panel supporting member 210. Using the same shaped panel supporting members 210, 220 may be advantageous, among other reasons, because the number of different parts in the foldable display apparatus. The second panel supporting member 220 may include a second base plate 221, a pair of lower ear parts 223, a pair of second side ear parts 225, and a pair of second screw through holes 227.

The second base plate 221 may be physically coupled to the rear surface of the second area 113 of the display panel 100 by the adhesive member. The second base plate 221 may be formed of a plastic material or a metal material, for maintaining the second area 113 of the flexible display panel 100 in a flat state. When the second base plate 221 is formed of a metal material, the second base plate 221 may also perform the function of dissipating heat generated in the display panel 100.

Each of the pair of lower ear parts 223 may protrude in a polygonal shape to have a certain length from a lower surface of the second base plate 221. The pair of lower ear parts 223 may be connected to a lower side of the second frame 400.

Each of the pair of second side ear parts 225 may protrude in a polygonal shape to have a certain length from both sides of an upper end of the second base plate 221 adjacent to the third panel supporting member 230. The pair of second side ear parts 225 may be connected to an upper end of the second frame 400.

The pair of second screw through holes 227 may be provided to respectively pass through the pair of second side ear parts 225 in direction Z. A pair of second screws (not shown) may be respectively inserted into the pair of second screw through holes 227. The pair of second screws may be coupled to the second frame 400 through the second screw through holes 227 and may detachably fix the second base plate 221 to the second frame 400.

The third panel supporting member 230 may support the bending area 115 of the display panel 100. The third panel supporting member 230 may not be physically coupled to the bending area 115 of the display panel 100 in order to enable the bending area 115 of the display panel 100 to bend with a certain radius of curvature or to be unfolded into a flat state. Particularly, the third panel supporting member 230 may support the bending area 115 of the display panel 100 only when the display panel 100 is unfolded into a flat state. In this way, the unfolded display panel is maintained in a flat state and the bending area 115 of the display panel 100 is prevented from being deformed (e.g., recessed) by a user touch. The third panel supporting member 230 according to an embodiment may be configured with a tetragonal plate formed of a hard plastic or metal material.

When the display panel 100 is unfolded, the third panel supporting member 230 may slide between the first and second panel supporting members 210 and 220 by the operation of the hinge assembly 500 and support the bending area 115 of the display panel 100. In the unfolded state, the top surface of the third panel supporting member 230 coming into contact with the bending area 115 is flush with the top surfaces of the first and second panel supporting member 210 and 220 fixed to the areas 111, 113. When the display panel 100 is folded, the third panel supporting member 230 may slide to overlap with the second panel supporting member 220 by the operation of the hinge assembly 500 to enable the bending area 115 of the display panel 100 to be bent.

The first frame 300 may support the first panel supporting member 210 and surround each side of the first area 111 of the display panel 100. The first frame 300 according to an embodiment may include a first base frame 310, a pair of first wing parts 320, a first bridge 330, and a pair of first shelf parts 340.

The first base frame 310 may be extend parallel to an upper surface of the display panel 100 and may surround an upper surface of the first area 111 of the display panel 100 to provide an upper surface flush with the upper surface of the display panel 100. Upper ear part insertion grooves 312 are provided in an inner surface of the first base frame 310. The pair of upper ear parts 213 provided on the first base plate 211 is inserted into the upper ear part insertion grooves 312. In addition, although not shown, additional elements (for example, a speaker, a front camera, an auxiliary light emitting diode (LED), various sensors, etc.) of the foldable display apparatus may be provided in the first base frame 310, and a portion of each of the additional elements may be exposed to the outside through an exposure hole (not shown) which is provided in the first base frame 310.

The pair of first wing parts 320 may be respectively connected to both ends of the first base frame 310 in parallel with a side of the display panel 100 and may surround both sides of the first area 111 of the display panel 100. A first ear insertion groove 322 including a first screw coupling hole 324 may be provided in each of both ends of the pair of first wing parts 322. The first ear insertion groove 322 may support the first side ear parts 215 which are provided on the first base plate 211 of the first panel supporting member 210, the first screw coupling hole 324 may be coupled to a first screw which passes through the first screw through hole 127 provided in the first side ear parts 215. Therefore, the first panel supporting member 210 may be detachably coupled to the first frame 300 by the first screw coupled to the first screw coupling hole 324.

The first bridge 330 connects lower inner surfaces of the pair of first wing parts 320 adjacent to the hinge assembly 500 and is also coupled to the hinge assembly 500. A hinge coupling groove 332 including a plurality of third screw coupling holes 334 may be provided in each of both edges of the first bridge 330. Also, a first cable tunnel 336 through which a signal cable (not shown) for a connection between a plurality of driving circuits for driving the display panel 100 passes may be provided in the first bridge 330.

The pair of first shelf parts 340 may protrude by a certain size inwards from respective inner surfaces of pair of first wing parts 320 in a symmetric manner, and support the first base plate 211 of the first panel supporting member 210.

As illustrated in FIG. 1, a bottom (or a rear surface) of the first frame 300 may be covered by a first rear cover 600. In this case, a battery, a communication module, and the system driver may be disposed in a space between the first frame 300 and the first rear cover 600.

Referring back to FIG. 3, the second frame 400 may support the second panel supporting member 220 and surround each side of the second area 113 of the display panel 100. The second frame 400 according to an embodiment may include a second base frame 410, a pair of second wing parts 420, a second bridge 430, a pair of second shelf parts 440, and a pair of axis supporting parts 450

The second base frame 410 may extend in parallel with a lower surface of the display panel 100 and may surround a lower surface of the second area 113 of the display panel 100. Lower ear insertion grooves 412 may be provided in an inner surface of the second base frame 410. The pair of lower ear parts 223 provided on the second base plate 221 is inserted into the lower ear insertion grooves 412. In addition, although not shown, additional elements (for example, a microphone, a home button switch, an input/output port, etc.) of the foldable display apparatus may be provided in the second base frame 410, and a portion of each of the additional elements may be exposed to the outside through an exposure hole (not shown) which is provided in the second base frame 410.

The pair of second wing parts 420 may be respectively connected to both ends of the second base frame 410 in parallel with a side of the display panel 100 and may surround both sides of the second area 113 of the display panel 100. Second ear insertion grooves 422, each including a second screw coupling hole 424 are provided at both ends of the pair of second wing parts 422. The second ear insertion grooves 422 support the second side ear parts 225 provided on the second base plate 221 of the second panel supporting member 220. The second screw coupling holes 424 are coupled to second screws passing through the second screw through holes 227 provided in the second side ear parts 225. Therefore, the second panel supporting member 220 may be detachably coupled to the second frame 400 by the second screws inserted into the second screw coupling holes 424.

The second bridge 430 may be connected between lower inner surfaces of the pair of second wing parts 420 which are adjacent to the hinge assembly 500 and are separated from each other by a distance corresponding to a width of the hinge assembly 500, and may be coupled to the hinge assembly 500. Also, a second cable tunnel 432 through which a signal cable (not shown) for a connection between a plurality of driving circuits for driving the display panel 100 passes may be provided in the second bridge 430.

The pair of second shelf parts 440 may protrude inwards by a certain size from respective inner surfaces of pair of second wing parts 420 in a symmetric manner, and support the second base plate 221 of the second panel supporting member 220.

The pair of axis supporting parts 450 may protrude from sides of both ends of the second bridge 430 which directly faces the hinge assembly 500, and may rotatably support the hinge assembly 500. A pin insertion groove may be provided in the pair of axis supporting parts 450.

As illustrated in FIG. 1, a bottom (or a rear surface) of the second frame 400 may be covered by a second rear cover 700.

In this case, a power circuit and a memory may be disposed in a space between the second frame 400 and the second rear cover 700.

Referring back to FIG. 3, the hinge assembly 500 may be connected between the first and second frames 300, 400 and may support the third panel supporting member 230. One side of the hinge assembly 500 may be fixed to the first frame 300, and the other side of the hinge assembly 500 may be rotatably connected to the second frame 400. Therefore, the hinge assembly 500 may slide the third panel supporting member 230 between a panel supporting position and an avoidance position according to rotation of the second frame 400. That is, the hinge assembly 500 may slide the third panel supporting member 230 from an avoidance position to a panel supporting position when the display panel 100 is unfolded. Conversely, the hinge assembly 500 may slide the third panel supporting member 230 from the panel supporting position to the avoidance position when the display panel 100 is folded. Particularly, the hinge assembly 500 may slide the third panel supporting member 230 according to rotation of the first frame 300 or the second frame 400, based on a semiautomatic folding mechanism using a torsion spring.

In the foldable display apparatus according to an embodiment of the present invention, the third panel supporting member 230 may slide between the panel supporting position and the avoidance position according to rotation of the hinge assembly 500. As a result, the bending area 115 of the unfolded display panel 100 may maintain a flat state as well as bending at a predetermined curvature. Particularly, in the foldable display apparatus according to an embodiment of the present invention, the third panel supporting member 230 may slide in a controlled manner by an elastic restoration force of the torsion spring, and thus, the display panel 100 is easily folded or unfolded.

Figure 4A:
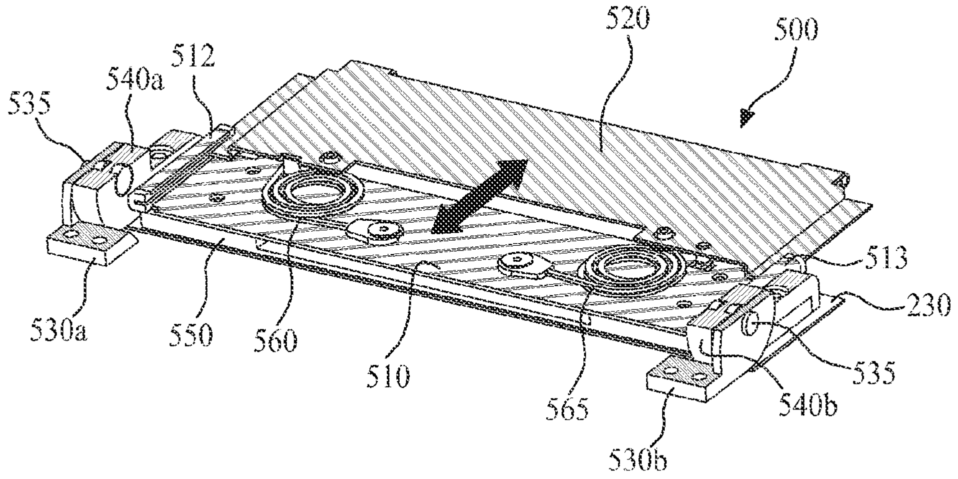
FIGS. 4A and 4B are diagrams for describing operations of the hinge assembly illustrated in FIGS. 2 and 3.
Figure 4B:
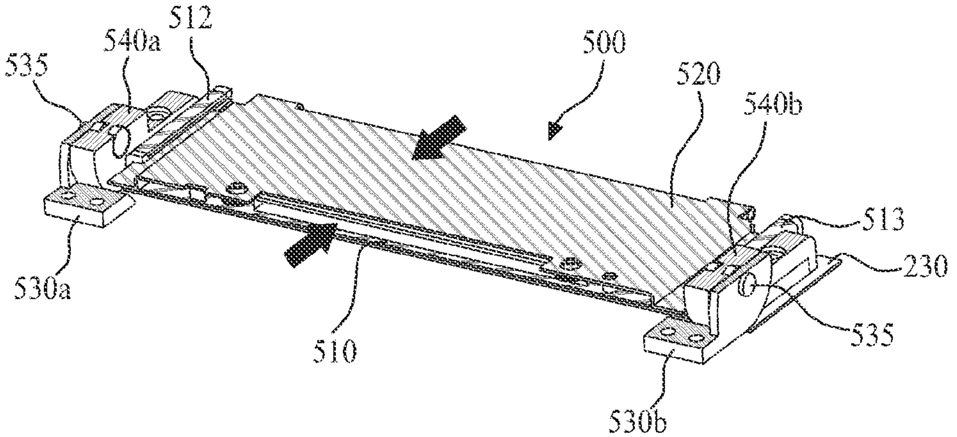
Figure 5:
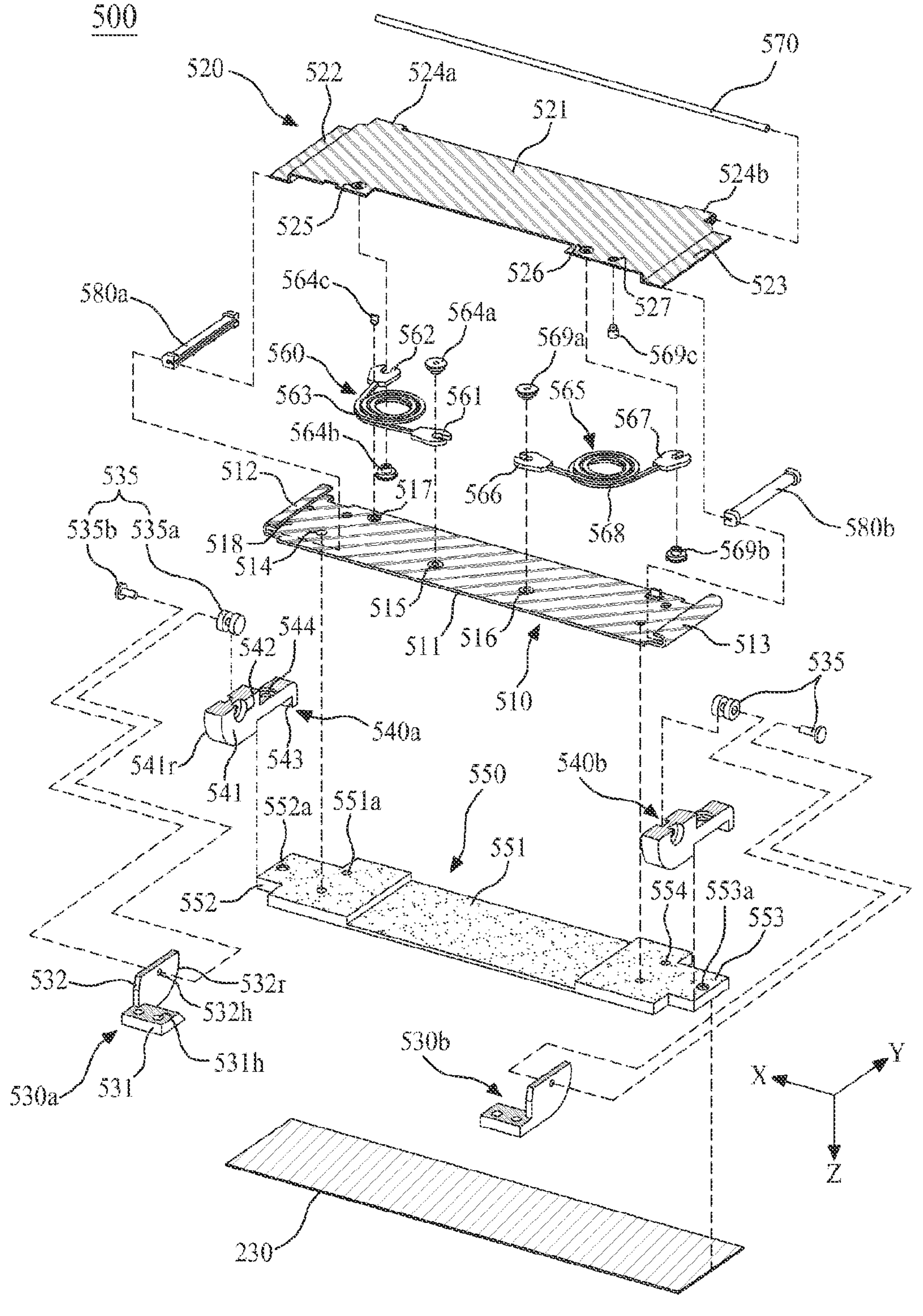
FIG. 5 is an exploded perspective view of the hinge assembly illustrated in FIGS. 4A and 4B.

FIGS. 4A and 4B are diagrams for describing an operation of the hinge assembly 500 illustrated in FIGS. 2 and 3. FIG. 5 is an exploded perspective view of the hinge assembly 500 illustrated in FIGS. 4A and 4B.

Referring to FIGS. 4A, 4B and 5, the hinge assembly 500 according to an embodiment of the present invention may include a slider 510, a sliding guider 520, a pair of first hinge parts 530*a* and 530*b*, a pair of second hinge parts 540*a* and 540*b*, a sliding bridge 550, a first torsion spring 560, a second torsion spring 565, and a rotation axis member 570.

The slider 510 may be slid when the display panel 100 is folded or unfolded, namely, the pair of second hinge parts 540*a* and 540*b* rotate. The slider 510 according to an embodiment may include a sliding plate 511, a first sliding slot 512, and a second sliding slot 513.

The sliding plate 511 may have a rectangular shape and may be formed of a plastic or metal material. Particularly, the sliding plate 511 may be formed of a metal material for enhancing durability.

The first sliding slot 512 may be bent twice from one short side of the sliding plate 511 to for a first slot. That is, the first sliding slot 512 may include a first side horizontal part that extends by a certain length from the short side of the sliding plate 511, a side vertical part that is vertically bent from the first side horizontal part to a certain height, and a second side horizontal part that is vertically bent from the side vertical part to extend along the first one side horizontal part. The first slot may be formed as the first and second side horizontal parts based on the side vertical part. As a result, the first sliding slot 512 may be provided at the one short side of the sliding plate 511 to have a C-shaped cross-sectional surface.

Similarly, the second sliding slot 513 may be bent twice from at the other short side of the sliding plate 511 to form a second slot. The structure of the second siding slot 513 is substantially the same as the first sliding slot 512, and hence detailed description thereof is omitted herein for the sake of brevity.

The sliding guider 520 may guide the slider 510 to slide along a predetermined trajectory. The sliding guider 520 according to an embodiment may include a sliding guide plate 521, a first sliding skirt 522, a second sliding skirt 523, and a pair of axis supporting parts 524*a* and 524*b*.

The sliding guide plate 521 may have a rectangular shape overlapping with the slider 510, more specifically, the sliding plate 511 of the slider 510. The sliding guide plate 521 may be formed of a plastic or metal material. Particularly, the sliding guide plate 521 may be formed of a metal material for enhancing durability.

The first sliding skirt 522 may be bent from one side of the sliding guide plate 521, may be inserted into the first sliding slot 512 of the slider 510, and may guide sliding of one side of the slider 510. The first sliding skirt 522 according to an embodiment may have a flipped L-shape that includes a one side vertical bending part, which is vertically bent from one side of the sliding guide plate 521, and a one side horizontal bending part that is bent from the one side vertical bending part in parallel with a length direction of the sliding guide plate 521. The first sliding skirt 522 may be thinner thickness than a gap between the first slot of the first sliding slot 512 to enable the third panel supporting member 230 to smoothly slid toward a rear surface of the second panel supporting member 220 when the third panel supporting member 230 (at the same plane as those of the first and second panel supporting members 210 and 220) is slid from the panel supporting position to the avoidance position.

Similarly, the second sliding skirt 523 is provided at the other side of the sliding guide plate 521 and is inserted into the second sliding slot 513 of the slider 510. The structure of the second sliding skirt 523 is substantially the same as the first sliding skirt 522, and therefore, the detailed description thereof is omitted herein for the sake of brevity.

The pair of axis supporting parts 524*a* and 524*b* may protrude from an upper surface of the sliding guide plate 521 and have an axis through hole. When assembled, the pair of axis supporting parts 524*a* and 524*b* is placed adjacent to the pair of axis supporting parts 450 of the second frame 400. That is, the pair of axis supporting parts 524*a* and 524*b* may be provided to have the axis through hole by performing a curling process on a protrusion that protrudes by a certain length from the upper surface of the sliding guide plate 521.

The pair of first hinge parts 530*a* and 530*b* may be coupled to the second frame 300 and may be rotatably coupled to the pair of second hinge parts 540*a* and 540*b*. In this case, the pair of first hinge parts 530*a* and 530*b* may be inserted into the hinge coupling groove 332 which is provided in the first bridge 330 of the first frame 300, and then may be fixed to the first bridge 330 by a plurality of third screws 531*a* (see FIG. 2). Each of the pair of first hinge parts 530*a* and 530*b* may include a hinge plate 531 and a hinge side wall 532.

The hinge plate 531 may be disposed in the hinge coupling groove 332 and may be fixed to the first bridge 330 by the plurality of third screws 531*a* coupled to the hinge coupling groove 332. To this end, a plurality of third screw through holes 531*h* may be provided in the hinge plate 531.

The hinge side wall 532 of the first hinge part 530*a* may extend from an outer portion of the hinge plate 531 and may be rotatably coupled to the pair of second hinge parts 540*a* and 540*b*. The hinge side wall 532 of the first hinge part 530*a* may come to contact and support the bending area 115 of the display panel 100 to bend the bending area 115 at a predetermined curvature when the display panel 100 is folded at one side portion of the bending area 115. The hinge side wall 532 may include a first rounding part 532*r* in the shape of a quadrant of a circle having approximately the same radius of curvature as a predetermined radius of curvature of the bending area 115 of the display panel 100 during folding of the display panel 100. Also, a joint through hole 532*h* for receiving the hinge joint member 535 may be provided in the hinge side wall 532. Similarly, the other side portion of the bending area 115 comes into contact and is supported by a hinge side wall of the first hinge part 530*b*. In this way, a bending curvature of the bent bending area 115 is maintained during the folding of the display panel 100. The hinge side wall of the first hinge part 530*b* is part is the same as the first hinge part 530*a*, and therefore, detailed description thereof is omitted herein for the sake of brevity.

The pair of second hinge parts 540*a* and 540*b* may be rotatably connected to the pair of first hinge parts 530*a* and 530*b* by the hinge joint member 535. The pair of second hinge parts 540*a* and 540*b* may slide the slider 510 while rotating at 0 to 180 degrees with the hinge joint member 535 as a rotation axis. At this time, the pair of second hinge parts 540*a* and 540*b* may not be coupled to the second frame 400. Each of the pair of second hinge parts 540*a* and 540*b* may include a rotation block 541, a joint disposition part 542, and a bridge coupling part 543.

The rotation block 541 may be disposed in parallel with the hinge side wall 532 of the first hinge parts 530*a* and 530*b*. The rotation block 541, in conjunction with the hinge side wall 532, may support and guide the bending area 115 of the display panel 100 so that the bending area 115 is bent at the predetermined curvature along with the first rounding part 532*r* provided on the hinge side wall 532 when the display panel 100 is folded. The pair of second hinge parts 540*a* and 540*b* support both ends of the bent bending area 115, and maintain the bending curvature of the bent bending area 115. To this end, the rotation block 541 may include a second rounding part 541*r* which is rounded in the shape of a quadrant of a circle having the same curvature as a predetermined curvature of the bending area 115 of the display panel 100 which is bent when the display panel 100 is folded.

The joint disposition part 542 may be recessed from a top of the rotation block 541 to receive the hinge joint member 535.

The bridge coupling part 543 may be recessed at a bottom of the rotation block 541 and may be coupled to the sliding bridge 550.

The hinge joint member 535 may be inserted into the joint disposition part 542 of the rotation block 541 of the pair of second hinge parts 540*a* and 540*b*, and may rotatably couple the pair of second hinge parts 540 to the pair of first hinge parts 530. The hinge joint member 535 according to an embodiment may include a main joint member 535*a* (rotatably inserted into the joint disposition part 542), and a joint pin 535*b* which passes through the joint through hole 535 provided in the pair of first hinge parts 530*a* and 530*b* and is coupled to the main joint member 535*a*. Therefore, the pair of second hinge parts 540*a* and 540*b* may be rotatably coupled to the pair of first hinge parts 530*a* and 530*b* fixed to the first frame 300 by the hinge joint member 535, and may slide the slider 510 while rotating at 0 to 180 degrees with the hinge joint member 535 as the rotation axis.

The sliding bridge 550 may be coupled to a top of the slider 510 and may connect the pair of second hinge parts 540*a* and 540*b*. The sliding bridge 550 may allow the pair of second hinge parts 540*a* and 540*b* to rotate at the same angle in cooperation with each other and may allow the slider 510 to be slid according to rotations of the pair of second hinge parts 540*a* and 540*b*. Also, the sliding bridge 550 may be physically coupled to the third panel supporting member 230 and may allow the third panel supporting member 230 to rotate or slide as the pair of second hinge parts 540*a* and 540*b* is rotated. The sliding bridge 550 according to an embodiment may include a bridge plate 551 and a pair of hinge coupling parts 552 and 553.

The bridge plate 551 may have a rectangular shape overlapping with the slider 510, more specifically, the sliding plate 511 of the slider 510. The bridge plate 551 may be formed of a plastic or metal material. Particularly, the bridge plate 551 may be formed of a metal material for enhancing durability. The bridge plate 551 may be coupled to a top of the sliding plate 511 of the slider 510 by a plurality of fourth screws (not shown). In this case, each of the fourth screws may pass through at least one fourth screw through hole 514 which is provided in both edges of the sliding plate 511, may be coupled to at least one fourth screw coupling hole 551*a* which is provided in the bridge plate 551, and may fix the bridge plate 551 to the sliding plate 511.

The pair of hinge coupling parts 552 and 553 may protrude by a certain length from both sides of the bridge plate 551. Each of the hinge coupling parts 552 and 553 is inserted into the bridge coupling parts 543 of the pair of second hinge parts 540*a* and 540*b*, and may be coupled and fixed to the rotation block 541 by fifth screws (not shown). The fifth screws passes through fifth screw through holes 544 in the rotation block 541*s* of the pair of second hinge parts 540*a* and 540*b*, coupled to a fifth screw coupling hole 522*a* in the pair of hinge coupling parts 552 and 553, and fix the bridge plate 551 to the rotation block 541 of the pair of second hinge parts 540*a* and 540*b*.

Each of the first and second torsion springs 560 and 565 may be connected between the slider 510 and the sliding guider 520 and may semiautomatically slide the slider 510.

The first torsion spring 560 may be disposed between the slider 510 and the sliding guider 520. The first torsion spring 560 may include one end 561 which is fixed to the rear surface of the one side of the slider 510 by a first spring fixing member 564*a*, another end 562 which is fixed to the top of the one side of the sliding guider 520 by a second spring fixing member 564*b*, and a torsion coil 563 between the one end 561 and the other end 562.

The first spring fixing member 564*a* may be coupled to a first spring fixing hole 515 which is provided in the rear surface of the one side of the slider 510 with the one end 561 of the first torsion spring 560 therebetween. The second spring fixing member 564*b* may be coupled to a second spring fixing hole 525 which is provided in the top of the one side of the sliding guider 520 with the other end 562 of the first torsion spring 560 therebetween.

In addition, a first stopper 564*c* for restricting a rotation angle of the first torsion spring 560 may be further provided in the slider 510. The first stopper 564*c* may be vertically disposed on the rear surface of the one side of the slider 510 corresponding to a space between the torsion coil 563 and the other end 562 of the first torsion spring 560 coupled to the sliding guider 520 to have a certain height, and thus may restrict rotation of the other end 562 of the first torsion spring 560 at a specific angle or more.

The second torsion spring 565 may be disposed between the other side of the slider 510 and the sliding guider 520. The second torsion spring 565 may include one end 566 which is fixed to the rear surface of the other side of the slider 510 by a third spring fixing member 569*a*, another end 567 which is fixed to the top of the other side of the sliding guider 520 by a fourth spring fixing member 569*b*, and a torsion coil 568 between the one end 566 and the other end 567.

The third spring fixing member 569*a* may be coupled to a third spring fixing hole 516 which is provided in the rear surface of the other side of the slider 510 with the one end 566 of the second torsion spring 565 therebetween. The fourth spring fixing member 569*b* may be coupled to a fourth spring fixing hole 526 which is provided in the top of the other side of the sliding guider 520 with the other end 567 of the second torsion spring 565 therebetween.

In addition, a second stopper 569*c* for restricting a rotation angle of the second torsion spring 565 may be further provided in the sliding guider 520. The second stopper 569*c* may be vertically disposed on the top of the other side of the sliding guider 520 corresponding to a space between the torsion coil 568 and the other end 567 of the second torsion spring 565 coupled to the sliding guider 520 to have a certain height, and thus may restrict rotation of the other end 562 of the second torsion spring 565 at a specific angle or more.

Each of the first and second torsion springs 560, 565 may slide the slider 510 between the panel supporting position and the avoidance position according to the principle that a direction of an elastic restoration force of each of the torsion coils 563 and 568 is changed with respect to a certain position. Particularly, when the slider 510 slides from the sliding guider 520 to a threshold distance in a total sliding distance according to rotation of the second frame 400, each of the first and second torsion springs 560 and 565 may exert force to automatically slide the slider 510 to the other distance according to the semiautomatic folding mechanism.

Figure 6A:
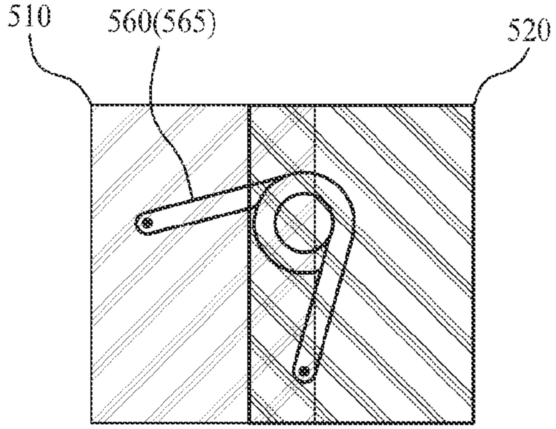
FIGS. 6A through 6C are diagrams for describing a semi-automatic folding mechanism of a slider illustrated in FIGS. 4A, 4B and 5.
Figure 6B:
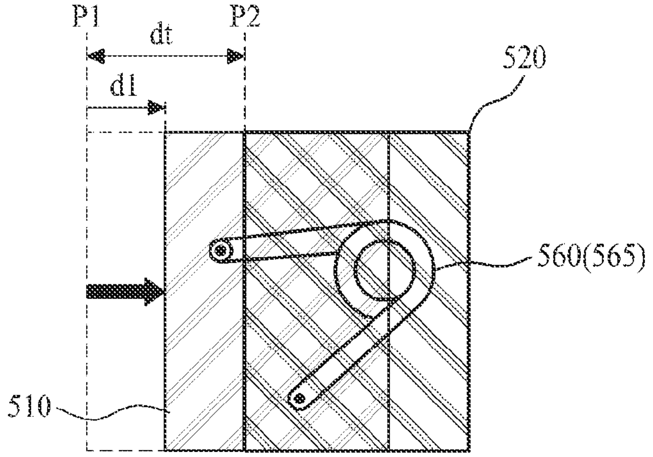
Figure 6C:
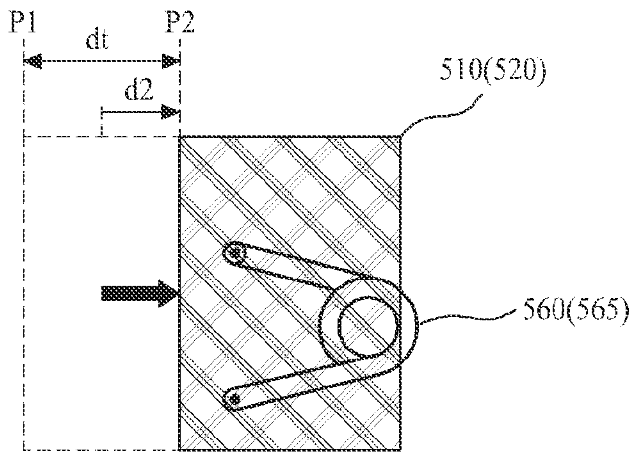

FIGS. 6A through 6C are diagrams illustrating the semiautomatic folding mechanism, according to one embodiment. FIG. 6A illustrates a state where one end of the slider 510 is slid to a panel supporting position P1 as is also shown in FIG. 4A. First, as seen in FIGS. 4A and 6A, the slider 510 remains in the panel supporting position P1 by an elastic restoration force of each of the first and second torsion springs 560 and 565. Subsequently, FIG. 6B illustrates the slider 510 in the midway between the panel supporting position P1 and the avoidance position P2 as the user partially folds the display panel 100. As illustrated in FIG. 6B, the slider 510 may slide from the panel supporting position P1 by a certain distance "dl" of a total sliding distance "dt" between the panel supporting position P1 and the avoidance position P2 according to the display panel 100 being folded by the user. Subsequently, as seen in FIGS. 4B and 6C, when the slider 510 slides from the panel supporting position P1 by the certain distance "dl" or more, the direction of the elastic restoration force of first and second torsion springs 560 and 565 may change in an opposite direction, and thus, the slider 510 may automatically slide to the remaining distance (dt-dl) by the elastic restoration force of the first and second torsion springs 560 and 565 into the avoidance position P2.

Therefore, the display panel 100 may be semiautomatically folded or unfolded along the direction of the elastic restoration force of each of the first and second torsion springs 560 and 565 which is generated when the display panel 100 is folded or unfolded by a certain angle by the user. Accordingly, according to an embodiment of the present invention, the display panel 100 can be folded and unfolded more easily.

Referring back to FIGS. 2 and 3, the rotation axis member 570 may rotatably connect the second frame 400 to the hinge assembly 500. That is, the hinge axis member 570 may rotatably connect the sliding guider 520 to the second frame 400 and may be inserted into a pin insertion groove of each of the pair of axis supporting parts 450 provided in the second frame 400 and an axis through hole of each of the pair of axis supporting parts 524*a* and 524*b* provided in the sliding guider 520. Referring to FIG. 5, the pair of axis supporting parts 450 and the pair of axis supporting parts 524*a*, 524*b* may extend in parallel and may be rotatably supported by the rotation axis member 570. The rotation axis member 570 may rotatably connect one side of the hinge assembly 500 (more specifically, one side of the sliding guider 520) to the second frame 400, and thus may act as a rotation axis about which the hinge assembly 500 rotates according to rotations of the pair of second hinge parts 540*a*, 540*b*. Therefore, the slider 510 may slide according to sliding-guide by the sliding guider 520, and the second frame 400 may slide in a direction opposite to a sliding direction of the slider 510.

Figure 7A:
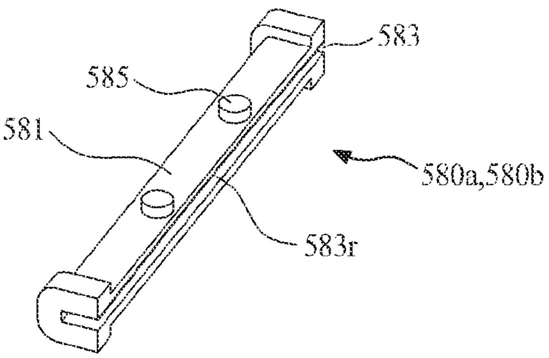
FIG. 7A is a perspective view of a sliding guide member illustrated in FIG. 5.
Figure 7B:
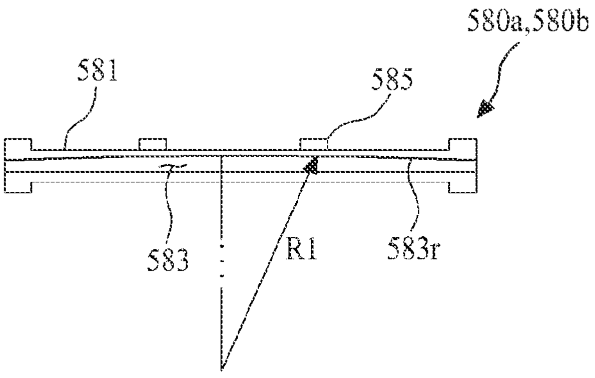
FIG. 7B is a cross-sectional view of the sliding member illustrated in FIG. 5.

The hinge assembly 500 may further include a pair of sliding guide members 580*a*, 580*b* placed fixed to the first and second sliding slots 512, 513 of the slider 510. The pair of sliding guide members 580*a*, 580*b* may allow the slider 510 to slide along the predetermined trajectory by controlling a sliding trajectory of the slider 510 which slides according to sliding-guide by the sliding guider 520. The pair of sliding guide members 580*a*, 580*b* according to an embodiment, as illustrated in FIGS. 7A and 7B may include a guide body 581, a guide slot 583, and a coupling projection 585.

The guide body 581 may be inserted into a slot which is provided in each of the sliding slots 512 and 513.

The guide slot 583 is recessed to a certain depth from along the inner surface of the guide body 581. Therefore, the guide body 581 may be provided to have a C-shaped cross-sectional surface including the guide slot 583. The sliding skirts 522, 523 of the sliding guider 520 may be inserted into the guide slot 583.

In addition, a top of the guide slot 583 may be a guide curved surface 583*r* which is recessed upward to have a predetermined radius of curvature R1. The guide curved surface 583*r* allows the third panel supporting member 230 to slide toward a rear surface of the second panel supporting member 220 more smoothly when the third panel supporting member 230 slides to the panel supporting position and is disposed on the same plane as those of the first and second panel supporting members 210, 220 in the avoidance position. Also, a bottom of the guide slot 583 parallel to the top of the guide slot 583 may be a guide curved surface which is recessed to have a predetermined curvature.

The coupling projection 585 may protrude by a certain height from a top of the guide body 581. The coupling projection 585 may be inserted into a projection insertion hole 518 which is provided in each of the sliding slots 512 and 513 of the slider 510, and thus may allow the sliding guide members 580*a* and 580*b* to be respectively inserted into and fixed to the sliding slots 512, 513.

Figure 8A:
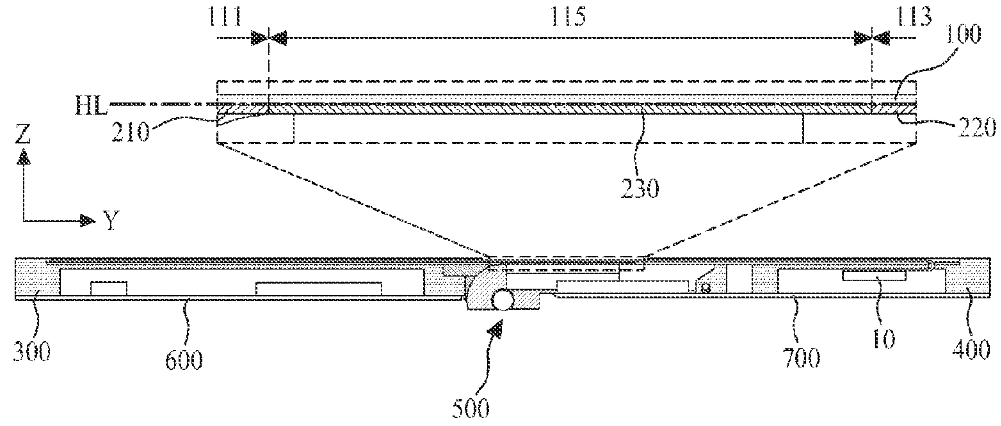
FIGS. 8A to 8D are cross-sectional views of a display panel in a foldable display apparatus as the display panel in various stages of bending, according to an embodiment of the present invention.

FIGS. 8A to 8D are cross-sectional views of a display panel in a foldable display apparatus as the display panel in various stages of bending, according to an embodiment of the present invention. First, as illustrated in FIG. 8A, the bending area 115 of the display panel 100 which is unfolded into a flat state may be supported by the third panel supporting member 230 which is coupled to the hinge assembly 500 and is slid to the panel supporting position, and thus may maintain the flat state. That is, the display panel 100 unfolded to the flat state may be supported by the first to third panel supporting members 210, 220 and 230 which are disposed on the same horizontal line HL, and thus may maintain the flat state without having curved or uneven top surfaces.

Figure 8B:
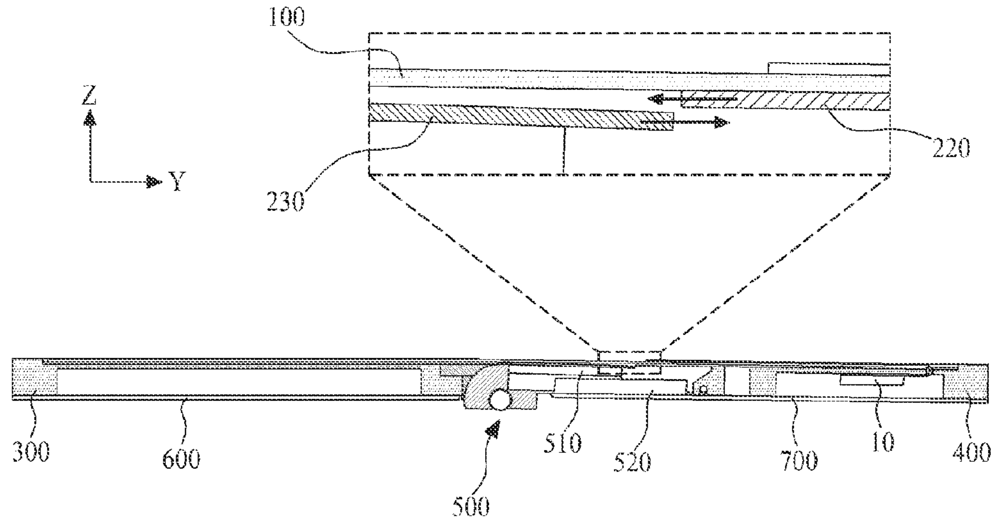

Subsequently, as illustrated in FIG. 8B, when the folding of the display panel 100 is started, the second frame 400 rotates to a first angle according to the rotation of the hinge assembly 500. As a result, the second and third panel supporting members 220, 230 may become dislocated from each other, and thus, the second frame 400 coupled to the second panel supporting member 220 may become movable onto the third panel supporting member 230. That is, when the display panel 100 is rotated slightly from the flat state, the second frame 400 is rotated at a certain angle, causing the slider 510 to slide along a trajectory defined by the movement of the sliding skirts 522, 523 of the sliding guider 520 in the sliding guide members 580*a*, 580*b* and rotations of the pair of second rotation parts 540*a*, 540*b*. At this time, the slider 510 may slid in a included direction from an upper portion to a lower portion due to a height of the slot provided in each of the sliding slots 512 and 513 of the slider 510 and a thickness deviation of the sliding skirts 522 and 523 or the guide curved surface 583*r* of each of the sliding guide members 580*a*, 580*b*, and thus, the third panel supporting member 230 connected to the slider 510 may overlap with a lower portion of the second panel supporting member 220. Therefore, the second panel supporting member 220 may slide onto the third panel supporting member 230, and thus, the second frame 400 coupled to the second panel supporting part 230 becomes movable onto the first frame 300.

Figure 8C:
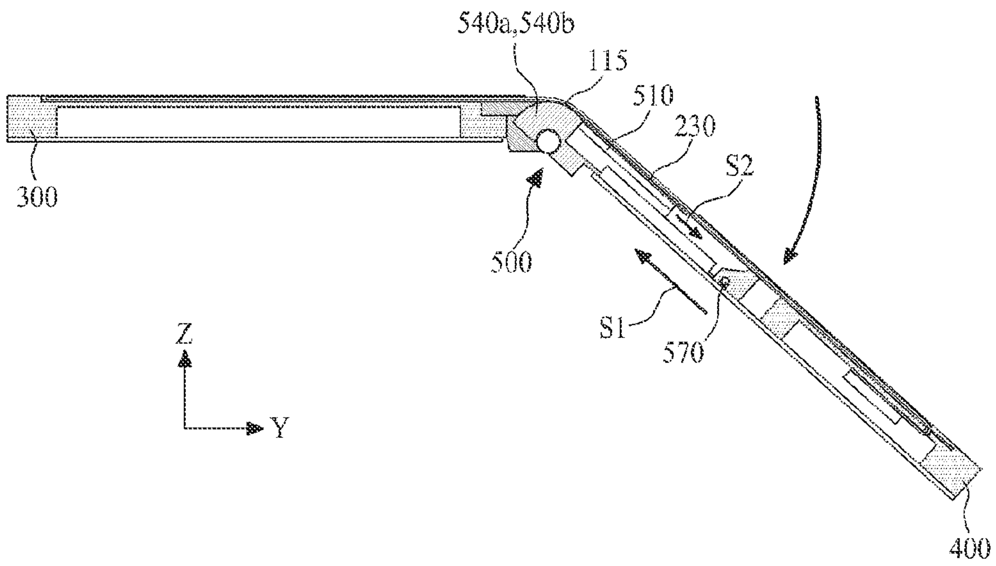
Figure 8D:
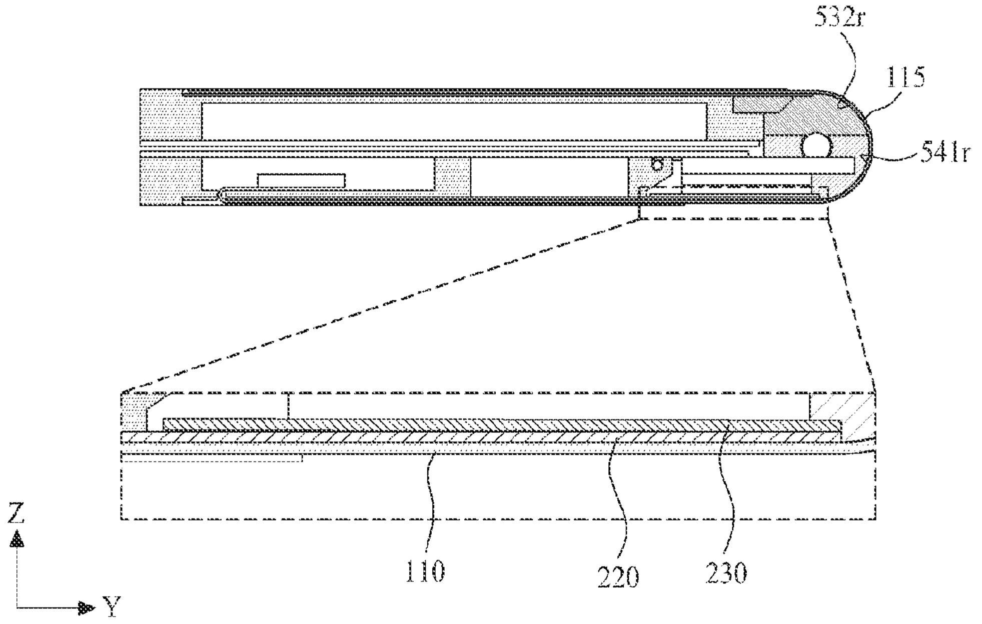

Subsequently, as illustrated in FIG. 8C, when the second frame 400 further rotates to a second angle greater than the first angle and in a folding state, the bending area 115 of the display panel 100 is bent according to the curvature of the first rounding parts 532*r* of first hinge parts 530*a*, 530*b* and the curvature of the second rounding parts 541*r* of second hinge parts 540*a*, 540*b*. Also, the second frame 400 may slide toward the first frame 300 according to a deviation of a curvature radius which occurs due to the bending area 115 being bent and has a hinge part as a center, and simultaneously, the slider 510 may be slid in a sliding direction S2 opposite to a sliding direction S1 of the second frame 400 according to rotations of the pair of second hinge parts 540*a*, 540*b*. Specifically, the second frame 400 may slide by a distance corresponding to a value obtained by multiplying a curvature radius of each of the second hinge parts 540*a*, 540*b* and a rotation angle of each of the second hinge parts 540*a* and 540*b* relative to a center of the hinge joint member 535. Therefore, when the display panel 100 is unfolded or folded, a bending stress applied to the bending area 115 of the display panel 100 is dispersed, thereby preventing reliability from being degraded due to the bending stress applied to the bending area 115 of the display panel 100.

Subsequently, when the second frame 400 is rotated to a threshold angle equal to or greater than the second angle, the slider 510 may automatically slide to the avoidance position according to the semiautomatic folding mechanism based on the elastic restoration force of each of the first and second torsion springs 560 and 565, and thus, the pair of second hinge parts 540*a* and 540*b* may be rotated by 180 degrees in cooperation therewith. Therefore, in the folded sate illustrated in FIG. 8D, the third panel supporting member 230 slides onto a rear surface of the second panel supporting member 220 according to sliding of the slider 510 and is hidden, and thus, the bending area 115 of the display panel 100 may be bent to have a curvature corresponding to a curvature of each of the first and second rounding parts 532*r* and 541*r* and may be supported by the first and second rounding parts 532*r* and 541*r*. Therefore, the display panel 100 may be folded in an out bending type, where the bending area 115 is exposed to the outside, with respect to the bending area 115.

The folded display panel 100 may be unfolded to a flat state according to the semiautomatic folding mechanism based on the operation in a sequence reverse to the above-described folding operation of the display panel 100. In an unfolding state, the bending area 115 of the display panel 100 is stably supported by the third panel supporting member 230 slides from the avoidance position to the panel supporting position. Accordingly, the bending area 115 of the display panel 100 in the flat state is prevented from being recessed by an external force, and the unfolded display panel 110 is maintained in the flat state.

As described above, according to the embodiments of the present invention, provided is a foldable display apparatus which can maintain a bending area of an unfolded display panel in a flat state and enables a display panel to be easily folded and unfolded.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A hinge assembly in a foldable display device, comprising:

a bending portion support assembly configured to couple to a first frame in a rotatable manner and configured to provide support for a bending portion of a flexible display panel in an unfolded state of the foldable display device, the first frame secured to a first area of the flexible display panel adjacent to a first side of the bending portion in the unfolded state to provide support for the first area of the flexible display panel, the bending portion support assembly comprising:

a first hinge part configured to secure to the first frame, and a second hinge part engaging with the first hinge part and coupled to a panel support member that provides a surface for supporting the bending portion in the unfolded state, the second hinge part configured to rotate about the first hinge part between the unfolded state and a folded state of the foldable display device; and a sliding member configured to couple to a second frame and slide relative to the bending portion support assembly with rotation of the first frame relative to the second frame, the second frame secured to a second area of the flexible display panel adjacent to a second side of the bending portion in the unfolded state to provide support for the second area of the flexible display panel.

2. The hinge assembly of claim 1, wherein at least one of the first hinge part or the second hinge part comprises a curved surface with a predetermined curvature, the curved surface configured to define curvature of the bending portion in a folding state, an unfolding state or a folded state of the foldable display device.

3. The hinge assembly of claim 1, further comprising sliding guiding members between the bending portion support assembly and the sliding member to control a sliding trajectory of the bending portion support assembly relative to the sliding member.

4. The hinge assembly of claim 3, wherein each of the sliding guiding members is formed with a guide slot configured to receive a sliding skirt of the bending portion support assembly, the guide slot having at least one curved surface having a radius of curvature across a plane perpendicular to a sliding direction of the bending portion support assembly to cause the bending portion support assembly to slide over or under a panel supporting member secured to the second frame in a folding or unfolding state of the foldable display device.

5. The hinge assembly of claim 1, further comprising a spring having a first end attached to the bending portion support assembly and a second end attached to the sliding member to apply resilient force to the sliding member in an unfolding state or folding state.

6. The hinge assembly of claim 5, wherein the spring is configured to:

apply the resilient force to place the foldable display device in the unfolded state responsive to a sliding distance of the sliding member relative the bending portion support assembly being smaller than a threshold distance; and apply the resilience force to place the foldable display device in a folded state responsive to the sliding distance of the sliding member being larger than the threshold distance.

7. The hinge assembly of claim 1, further comprising a rotation axis member inserted into the sliding member and the second frame to couple the sliding member to the second frame in a rotatable manner.

8. The hinge assembly of claim 1, wherein the bending portion support assembly comprises:

a bending portion support member for providing a supporting surface to the bending portion of the flexible display panel;

a sliding bridge secured to the bending portion support member;

a set of hinge parts, each of the hinge parts secured to a side portion of the sliding bridge; and a slider secured to the sliding bridge and formed with sliding slots configured to receive ends of the sliding member in a slidable manner.

9. The hinge assembly of claim 8, wherein sliding guide members coming into touch with the sliding member are secured into the sliding slots, the sliding guide members formed with protrusions or holes for securing the sliding guide members.

10. A foldable display device, comprising:

a flexible display panel;

a first frame configured to secure a first area of the flexible display panel;

a second frame configured to secure a second area of the flexible display panel; and a hinge assembly between the first frame and the second frame, the hinge assembly comprising:

a bending portion support assembly coupled to the first frame in a rotatable manner and providing support for a bending portion of the flexible display panel between the first area and the second area in an unfolded state of the foldable display device, and a sliding member coupled to the second frame and slidable relative to the hinge assembly with rotation of the first frame relative to the second frame;

a first supporting member between the first frame and the first area, the first supporting member having a flat surface onto which the first area is secured; and a second supporting member between the second frame and the second area, the second supporting member having a flat surface onto which the second area is secured.

11. The foldable display device of claim 10, wherein the bending portion support assembly comprises a bending portion support member for providing a supporting surface to the bending portion of the flexible display panel, the bending portion support member having a top surface that is flush with a top surface of the first supporting member and a top surface of the second supporting member in the unfolded state.

12. The foldable display device of claim 11, wherein the bending portion support assembly further comprises:

a sliding bridge secured to the bending portion support member;

a set of hinge parts, each of the hinge parts secured to a side portion of the sliding bridge; and a slider secured to the sliding bridge and formed with sliding slots configured to receive ends of the sliding member in a slidable manner.

13. The foldable display device of claim 12, wherein the set of hinge parts comprises a curved surface with a predetermined curvature, the curved surface defining curvature of the bending portion in a folding state, a unfolding state or a folded state of the foldable display device.

14. The foldable display device of claim 10, further comprising sliding guiding members between the bending portion support assembly and the sliding member to control a sliding trajectory of the bending portion support assembly relative to the sliding member.

15. The foldable display device of claim 14, wherein each of the sliding guiding members is formed with a guide slot configured to receive a sliding skirt of the bending portion support assembly, the guide slot having at least one curved surface having a radius of curvature across a plane perpendicular to a sliding direction of the bending portion support assembly to cause the bending portion support assembly to slide over or under a panel supporting member secured to the second frame in a folding state or in a unfolding state.

16. The foldable display device of claim 10, further comprising a spring having a first end attached to the bending portion support assembly and a second end attached to the sliding member to apply resilient force to the sliding member in an unfolding state or folded state.

17. The foldable display device of claim 16, wherein the spring is configured to:

apply the resilient force to place the foldable display device in the unfolded state responsive to a sliding distance of the sliding member relative the bending portion support assembly being smaller than a threshold distance; and apply the resilience fore to place the foldable display device in a folded state responsive to the sliding distance of the sliding member being larger than the threshold distance.

18. A method of folding or unfolding a foldable display device, comprising:

in an unfolded state of the foldable display device, supporting a first area of a flexible display panel by a first frame secured to a first hinge part of a hinge assembly, a second area of the flexible display panel by a second frame and a bending portion of the flexible display panel by the hinge assembly between the first frame and the second frame;

rotating, about the first hinge part, a second hinge part of the hinge assembly engaging with the first hinge part and coupled to a panel support member that provides a surface for supporting the bending portion in the unfolded state between the unfolded state and a folded state of the foldable display device; and responsive to rotating the first frame relative to the second frame from the unfolded state, sliding a sliding member of the hinge assembly coupled to the second frame relative to a bending portion support assembly coupled to the first frame.

* * * * *